(12) United States Patent
Kim

(10) Patent No.: US 9,263,706 B2
(45) Date of Patent: Feb. 16, 2016

(54) METHOD OF MANUFACTURING FLEXIBLE DISPLAY APPARATUS

(71) Applicant: Samsung Display Co., Ltd., Yongin, Gyeonggi-Do (KR)

(72) Inventor: Ki-Hyun Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 510 days.

(21) Appl. No.: 13/829,643

(22) Filed: Mar. 14, 2013

(65) Prior Publication Data

US 2014/0141547 A1    May 22, 2014

(30) Foreign Application Priority Data

Nov. 16, 2012   (KR) .................. 10-2012-0130512

(51) Int. Cl.
*H01L 21/00* (2006.01)
*H01L 51/56* (2006.01)

(52) U.S. Cl.
CPC ......... *H01L 51/56* (2013.01); *H01L 2251/5338* (2013.01)

(58) Field of Classification Search
CPC ....................................................... H01L 21/00
See application file for complete search history.

(56) References Cited

U.S. PATENT DOCUMENTS

| | | |
|---|---|---|
| 8,199,269 B2 | 6/2012 | Hattori et al. |
| 8,241,751 B2 | 8/2012 | Tomamoto et al. |
| 2007/0281089 A1 | 12/2007 | Heller et al. |
| 2010/0092781 A1 | 4/2010 | Zambov et al. |

FOREIGN PATENT DOCUMENTS

| | | |
|---|---|---|
| KR | 10-2009-006735 | 1/2009 |
| KR | 10-2012-0028443 A | 3/2012 |
| KR | 10-2012-0048518 A | 5/2012 |
| WO | WO87/06626 | 11/1987 |
| WO | WO2008/057625 A2 | 5/2008 |
| WO | WO2008/121478 A2 | 10/2008 |
| WO | WO2010/038761 A1 | 4/2010 |

*Primary Examiner* — Marvin Payen
(74) *Attorney, Agent, or Firm* — Lewis Roca Rothgerber Christie LLP

(57) ABSTRACT

A method of manufacturing a flexible display apparatus, the method including forming a thin film transistor (TFT), a first electrode, and a pixel defining film on a flexible substrate by using a roll-to-roll device; separating the flexible substrate from the roll-to-roll device; attaching the flexible substrate to a support substrate; forming an organic light-emitting diode (OLED) and an encapsulating layer at the first electrode; and separating the flexible substrate from the support substrate.

16 Claims, 8 Drawing Sheets

METHOD OF MANUFACTURING FLEXIBLE DISPLAY APPARATUS

CROSS-REFERENCE TO RELATED PATENT APPLICATION

This application claims priority to and the benefit of Korean Patent Application No. 10-2012-0130512, filed in the Korean Intellectual Property Office on Nov. 16, 2012, the entire content of which is incorporated herein by reference.

BACKGROUND

1. Field

The present invention relates to a method of manufacturing a flexible display apparatus.

2. Description of the Related Art

Recently, use of liquid crystal display (LCD) devices and organic light emitting display devices, each including thin film transistors (TFTs), has been expanded to the market of display devices for mobile devices, such as digital cameras, video cameras, personal digital assistants (PDAs), and mobile phones.

Such display devices for mobile devices are ideally portable, thin (e.g., for use in display devices having various shapes), light, and flexible. To this end, it has been suggested that manufacturing steps performed on a flexible substrate of a display device (e.g., formed from a thin glass material) should be performed after the flexible substrate is first attached to a support substrate.

In many instances, however, the support substrate and the flexible substrate are united together and are thus difficult to be separated from each other at high temperatures.

SUMMARY

Exemplary embodiments according to the present invention provide a method of manufacturing a flexible display apparatus in which a support substrate and a flexible substrate can be relatively easier to separate from each other.

According to an aspect of the present invention, there is provided a method of manufacturing a flexible display apparatus, the method including forming a thin film transistor (TFT), a first electrode, and a pixel defining film on a flexible substrate by using a roll-to-roll device; separating the flexible substrate from the roll-to-roll device; attaching the flexible substrate to a support substrate; forming an organic light-emitting diode (OLED) and an encapsulating layer on the first electrode; and separating the flexible substrate from the support substrate.

The flexible substrate may be a glass substrate.

The glass substrate may have a thickness in a range of 0.05 millimeters (mm) to 0.1 mm.

The method may further include cleansing the flexible substrate after forming the TFT, the first electrode, and the pixel defining film, and before separating the flexible substrate from the roll-to-roll device.

The forming of the encapsulating layer may include forming a multilayer layer including an organic layer and an inorganic layer on the OLED.

The TFT, the first electrode, and the pixel defining film may be formed at a temperature higher than a temperature at which the OLED and the encapsulating layer are formed on the first electrode.

According to another aspect of the present invention, there is provided a method of manufacturing a flexible display apparatus, the method including forming a TFT, a first electrode, and a pixel defining film on a flexible substrate using a roll-to-roll device; separating the flexible substrate from the roll-to-roll device and attaching the flexible substrate to a support substrate; forming an intermediate layer including an emissive layer, and a second electrode on the first electrode; and separating the flexible substrate from the support substrate.

The flexible substrate may be a glass substrate and have a thickness in a range of 0.05 mm to 0.1 mm.

The support substrate may be a glass substrate and have a thickness in a range of 0.4 mm to 0.6 mm.

The method may further include, after forming the pixel defining film and before positioning the flexible substrate at the support substrate, cleansing the flexible substrate and cutting the flexible substrate.

The first electrode may be an anode, and the second electrode may be a cathode.

The method may further include, after forming the second electrode and before separating the flexible substrate from the support substrate, forming an encapsulating layer; and forming a polarizing plate on the encapsulating layer.

The TFT, the first electrode, and the pixel defining film may be formed at a temperature higher than a temperature at which the intermediate layer including the emissive layer and the second electrode are formed on the first electrode.

According to another aspect of the present invention, there is provided a method of manufacturing a flexible display apparatus, the method including forming a thin film transistor (TFT), a first electrode, and a pixel defining film on a flexible substrate using a roll-to-roll device; performing a cleansing process on the flexible substrate and attaching the flexible substrate to a support substrate to be combined with the support substrate; forming an organic light emitting diode (OLED) on the flexible substrate and forming an encapsulating layer on the OLED; and separating the flexible substrate from the support substrate.

The flexible substrate and the support substrate may be glass substrates, and the flexible substrate may be thinner than the support substrate.

The flexible substrate may have a thickness in a range of 0.05 mm to 0.1 mm, and the support substrate may have a thickness in a range of 0.4 mm to 0.6 mm.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
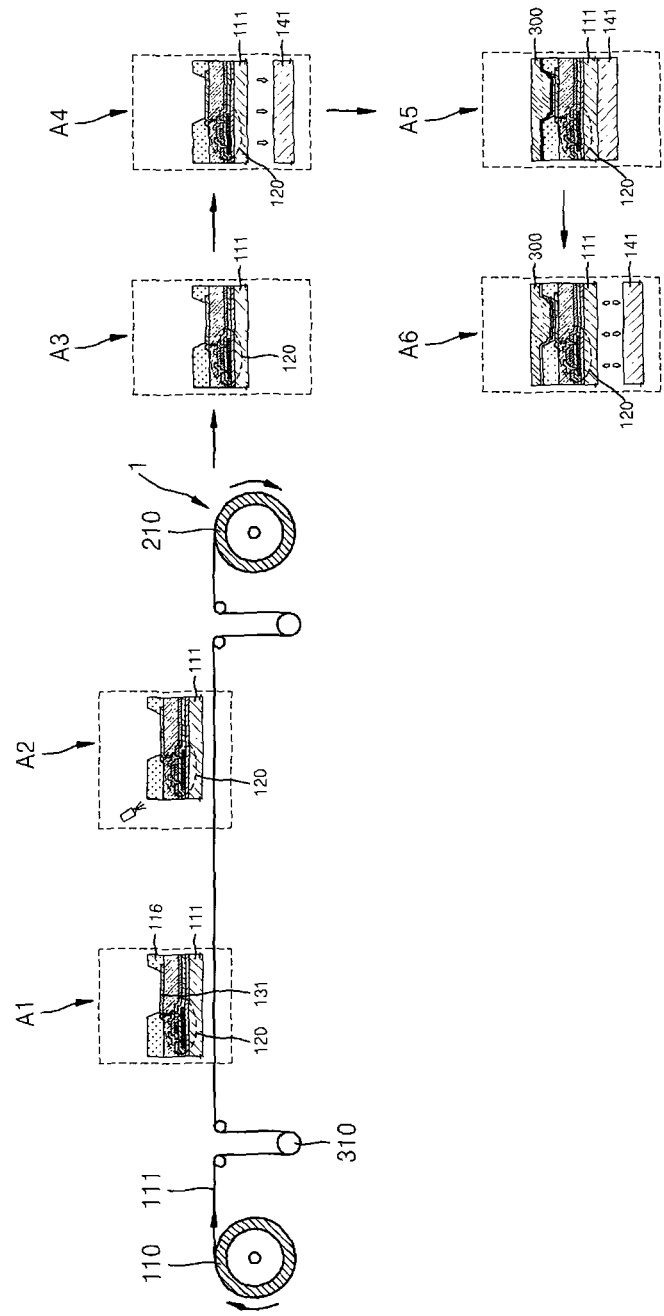
FIG. 1 is a schematic view of a case in which a roll-to-roll method is used to manufacture a flexible display apparatus according to an embodiment of the present invention.

The present invention will be described more fully hereinafter with reference to the accompanying drawings, in which exemplary embodiments of the invention are shown. This invention may, however, be embodied in many different forms and should not be construed as limited to the exemplary embodiments set forth herein and the exemplary embodiments are to cover all modifications, equivalents, and alternatives falling within the scope of the invention. In the following description, well-known functions or constructions are not described in detail if it is determined that they would obscure the invention due to unnecessary detail.

It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms 'a', 'an' and 'the' are intended to include the plural forms as well, unless the context clearly indicates otherwise. It will be further understood that the terms 'comprise' and 'include' when used in this specification, specify the presence of stated features, integers, steps, operations, elements, and/or components, but do not preclude the presence or addition of one or more other features, integers, steps, operations, elements, components, and/or groups thereof.

In the drawings, the thickness of layers and regions may be exaggerated for clarity. The same reference numerals represent the same elements throughout the drawings. It will be understood that when an element or layer is referred to as being "on" another element or layer, the element or layer can be directly on another element or layer or intervening elements or layers. In contrast, when an element is referred to as being "directly on" another element or layer, there are no intervening elements or layers present.

As used herein, the term "and/or" includes any and all combinations of one or more of the associated listed items, and expressions such as "at least one of," when preceding a list of elements, modify the entire list of elements and do not modify the individual elements of the list.

Figure 2:
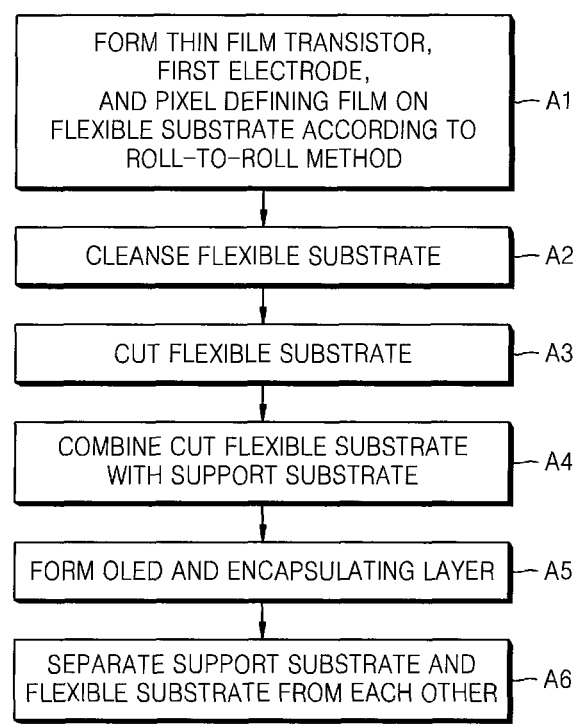
FIG. 2 is a flowchart schematically illustrating a process of manufacturing a flexible display apparatus according to an embodiment of the present invention.

FIG. 1 is a schematic view of a case where a roll-to-roll method is used to manufacture a flexible display apparatus according to an embodiment of the present invention. FIG. 2 is a flowchart schematically illustrating a process of manufacturing a flexible display apparatus according to an embodiment of the present invention.

Referring to FIGS. 1 and 2, a flexible substrate 111 is prepared in a state in which it is wound on a feed roll 110. The flexible substrate 111 may be formed of an insulating material and may include a flexible material, such as thin glass. The thin glass may have a thickness in a range of 0.05 millimeters (mm) to 0.1 mm.

The flexible substrate 111 may have flexible properties for forming a printed circuit board (PCB). A retrieving roll 210 is located at a side opposite to the side at which the feed roll 110 is located to wind up and retrieve the flexible substrate 111. Processes of manufacturing the PCB are performed on the flexible substrate 111 while the flexible substrate 111 wound on the feed roll 110 is being unwound, and the flexible substrate 111 is then wound up by the retrieving roll 210.

Tension maintaining members 310 may be installed adjacent to the feed roll 110 and the retrieving roll 210 so as to maintain tension applied to the flexible substrate 111 that is being transferred, respectively.

Devices are manufactured using a roll-to-roll device 1 to perform various processes in a direction in which the flexible substrate 111 is moved to form a thin film transistor (TFT) 120, a first electrode 131, and a pixel defining film 116 on a front surface of the flexible substrate 111 (operation A1).

Then, a cleansing process is performed on the flexible substrate 111 (operation A2). A rear surface of the flexible substrate 111 cleansed according to the cleansing process is positioned on a support substrate 141 during a subsequent process.

The cleansing process may be performed using dry cleansing or wet cleansing. When the cleaning process is performed using dry cleansing, $CO_2$, ultrasound waves, or laser pulses may be used but the present invention is not limited thereto.

Although the cleansing process is described above as being performed using the roll-to-roll device 1, the present invention is not limited thereto and the flexible substrate 111 may be cleansed after being separated from the roll-to-roll device 1.

Then, the flexible substrate 111 is cut to a size (e.g., a predetermined or desired size) (operation A3). The size of the flexible substrate 111 after being cut may vary according to process devices and conditions in subsequent processes.

Then, the cut flexible substrate 111 is attached to (e.g., mounted on, disposed on, located on, or coupled to) the support substrate 141 to be combined with the support substrate 141 (operation A4).

The support substrate 141 may be a glass substrate and may have a thickness of 0.4 mm to 0.6 mm. However, the present invention is not limited thereto, and the support substrate 141 may be formed of any of other various materials, e.g., transparent plastic or metal, which are capable of supporting the flexible substrate 111 and are resistant to process stresses.

Then, an organic light-emitting diode (OLED) and an encapsulating thin film are formed on the flexible substrate 111 (operation A5).

Then, the combined support substrate 141 and flexible substrate 111 are separated from each other (operation A6).

The forming of the TFT 120, the first electrode 131, the pixel defining film 116 using the roll-to-roll device 1 (operation A1) may be performed at a high temperature of 200° C. or more. When such a high-temperature process is performed in a state in which the flexible substrate 111 and the support substrate 141 are combined, the flexible substrate 111 and the support substrate 141 may be united together not to be separated from each other.

According to an embodiment of the present invention, after the high-temperature process is performed on the flexible substrate 111 by using the roll-to-roll device 1, the flexible substrate 111 and the support substrate 141 are combined with each other, and the OLED and the encapsulating thin film are formed at relatively low temperatures. Thus, the combined flexible substrate 111 and support substrate 141 may be relatively easier to separate from each other. Also, damage to the flexible substrate 111 may be prevented or reduced during the separation of the flexible substrate 111 and the support substrate 141, thereby reducing manufacturing costs and increasing process reliability.

FIGS. 3 to 12 are cross-sectional views schematically illustrating a process of manufacturing a flexible display apparatus according to an embodiment of the present invention.

Figure 3:
FIGS. 3 to 13 are cross-sectional views schematically illustrating a process of manufacturing a flexible display apparatus according to an embodiment of the present invention.

Referring to FIG. 3, a flexible substrate 111 is prepared from the feed roll 110 of FIG. 1.

The flexible substrate 111 has flexible properties for forming a PCB, is formed of an insulating material, and may include a flexible material, such as thin glass. The thin glass may have a thickness of 0.05 mm to 0.1 mm but the present invention is not limited thereto. The flexible substrate 111 has high heat-resistant and endurable properties, and may be formed of a plastic material having high heat-resistant and durable properties, such as polyethylene ether phthalate, polyethylene naphthalate, polycarbonate, polyarylate, polyetherimide, polyethersulfone, or polyimide.

Figure 4:
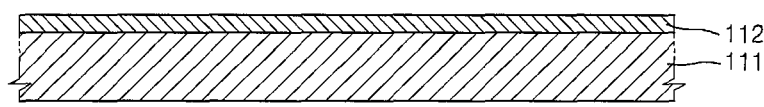

Next, referring to FIG. 4, a buffer layer 112 may be formed on the flexible substrate 111. The buffer layer 112 may include at least one of an inorganic film or an organic film. The buffer layer 112 may prevent or reduce moisture or impurity substances from being diffused into the flexible substrate 111 or may control the speed of delivering heat to the flexible substrate 111 during a crystalline process, thereby helping crystallization of a semiconductor.

Figure 5:
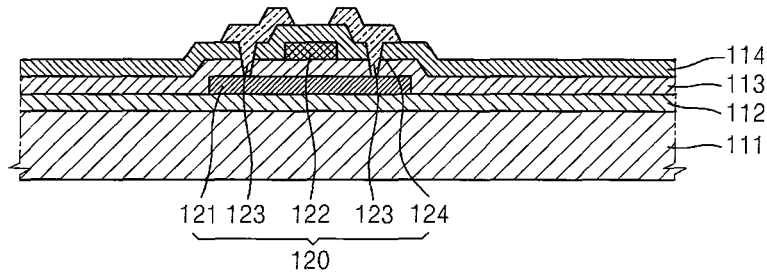

Next, referring to FIG. 5, a TFT 120 is formed on the buffer layer 112. FIG. 5 illustrates a case in which a top gate TFT is formed as an example of the TFT 120. However, the present invention is not limited thereto and a TFT having a different structure, e.g., a bottom gate TFT, may be formed. For convenience of explanation, a case in which the TFT 120 illustrated in FIG. 5 is formed is described below.

When the TFT 120 is a top gate type, a semiconductor layer 121, a gate insulating film 113, a gate electrode 122, an interlayer insulating film 114, contact holes 124, and source and drain electrodes 123 are sequentially formed on the buffer layer 112.

The semiconductor layer 121 may be formed of polysilicon such that a region of the semiconductor layer 121 is doped with impurities. Otherwise, the semiconductor layer 121 may be formed of amorphous silicon, or any of various other organic semiconductor materials, e.g., pentacene.

In order to form the semiconductor layer 121 using polysilicon, a layer may be formed of amorphous silicon and then be crystallized into polysilicon. In this case, one of various crystallization methods, e.g., rapid thermal annealing (RTA), solid phase crystallization (SPC), excimer laser annealing (ELA), metal induced crystallization (MIC), metal induced lateral crystallization (MILC), and sequential lateral solidification (SLS), may be used.

A gate insulating film 113 is formed between the semiconductor layer 121 and the gate electrode 122 to insulate the semiconductor layer 121 and the gate electrode 122 from each other. The gate insulating film 113 may be formed of an insulating material, e.g., a silicon oxide or a silicon nitride. Otherwise, the gate insulating film 113 may be formed of an organic insulating material.

The gate electrode 122 may be formed of one of various conductive materials, e.g., Mg, Al, Ni, Cr, Mo, W, MoW, and Au. In this case, the gate electrode 122 may be formed in a single layer form or a multiple layer form.

The interlayer insulating film 114 may be formed of an insulating material, e.g., a silicon oxide or a silicon nitride. Otherwise, the interlayer insulating film 114 may be formed of an organic insulating material. The interlayer insulating film 114 and the gate insulating film 113 may be selectively removed to form the contact holes 124 through which source and drain regions 121 are exposed. Then, the source and drain electrodes 123 are each formed in a single or multiple layer form on the interlayer insulating film 114 by using the material of the gate electrode 122, such that the contact holes 124 are filled with the source and drain electrodes 123, respectively.

Figure 6:
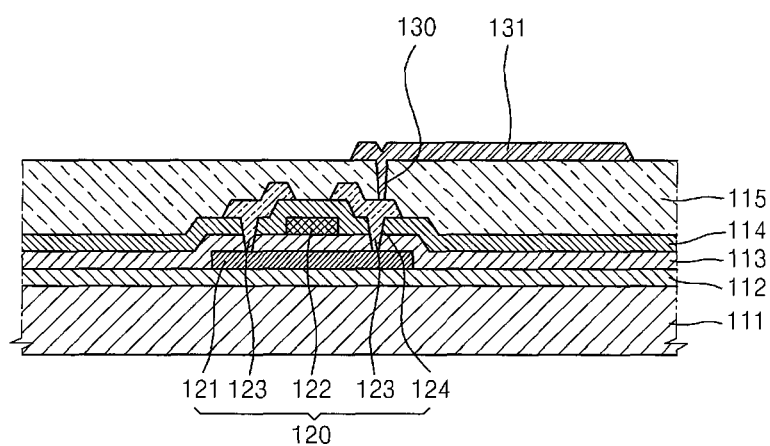

Referring to FIG. 6, a planarizing film (e.g., a protective film and/or passivation layer) 115 is formed on the source and drain electrodes 123 to protect and planarize the TFT 120 below the planarizing film 115.

The planarizing film 115 may have any of various shapes, and may be formed of an organic material, such as benzocyclobutene (BCB) or acryl, an inorganic material, such as silicon nitride (SiNx). Also, the planarizing film 115 may have a single layer form or a dual or multiple layer form.

Then, a first electrode 131 is formed on the planarizing film 115 to form an OLED on the TFT 120. The first electrode 131 is electrically coupled to one of the source and drain electrodes 123 via a contact hole 130. The first electrode 131 may function as an anode or a cathode, and may be formed of any of various conductive materials.

The first electrode 131 may be formed as a transparent electrode or a reflective electrode according to an emission type. When the first electrode 131 is a transparent electrode, the first electrode 131 may be formed of ITO, IZO, ZnO, or $In_2O_3$. When the first electrode 131 is a reflective electrode, a reflective film, formed of at least one material selected from the group consisting of Ag, Mg, Al, Pt, Pd, Au, Ni, Nd, Ir, and Cr and ITO, IZO, ZnO, or $In_2O_3$, may be deposited on the reflective layer.

Figure 7:
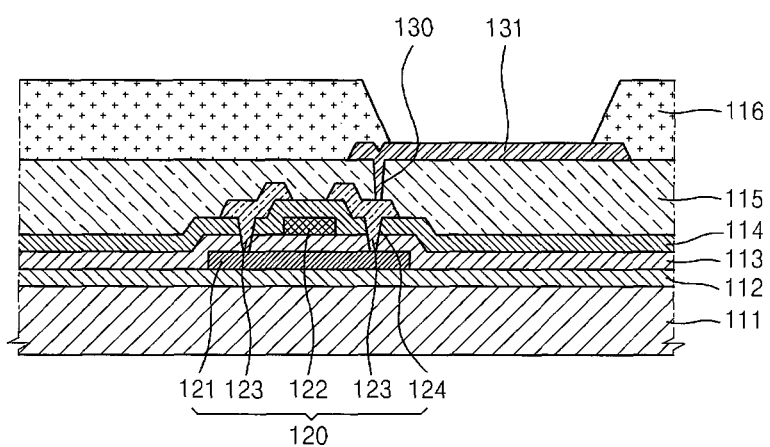

Then, referring to FIG. 7, a pixel defining film 116 formed of an insulating material is formed on the first electrode 131 and is patterned such that at least a portion of the first electrode 131 is exposed.

The pixel defining film 116 may be an inorganic film formed of an inorganic material selected from the group consisting of silicon oxide ($SiO_2$), SiNx, or other suitable inorganic material with similar properties.

Figure 8:
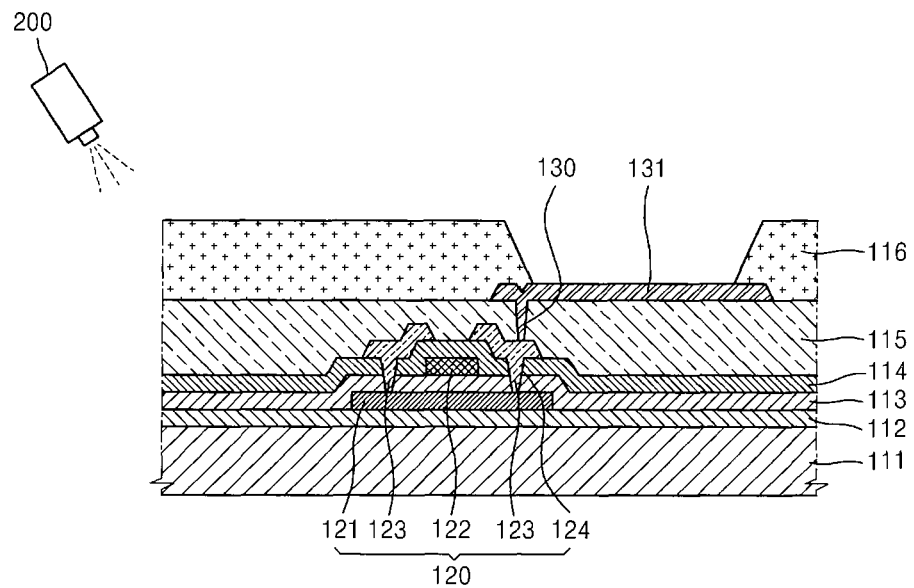

Then, referring to FIG. 8, a cleansing process is performed using a cleansing device 200. The cleansing process may be performed while using the roll-to-roll device 1 of FIG. 1 but the present invention is not limited thereto. In another embodiment, the cleansing process is performed after the flexible substrate 111 is separated from the roll-to-roll device 1.

Then, the flexible substrate 111, separated from the roll-to-roll device 1, is cut to a size (e.g., a predetermined or desired size). The size of the flexible substrate 111 after being cut may vary according to process devices and conditions used in subsequent processes.

Figure 9:
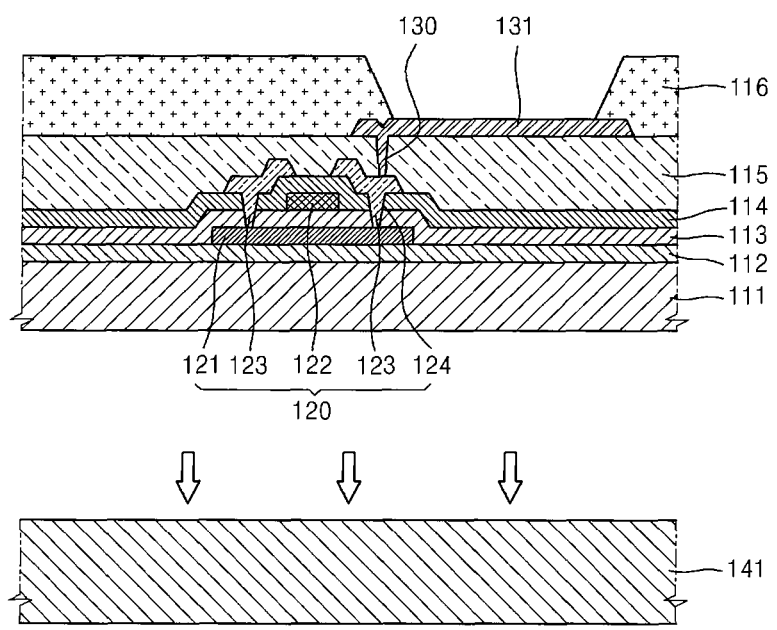

Then, referring to FIG. 9, the cut flexible substrate 111 is attached onto the support substrate 141 of FIG. 1 to be combined with the support substrate 141. Some of the processes described above with reference to FIGS. 3 to 7 are performed at high temperatures of 200° C. or more, but subsequent processes are performed at relatively low temperatures. Thus, although the subsequent processes are performed in a state in which the support substrate 141 and the flexible substrate 111 are combined with each other, the support substrate 141 and the flexible substrate 111, performing the subsequent processing steps at lower temperatures may improve the ease with which the support substrate 141 and the flexible substrate 11 may be separated.

The support substrate 141 may be a glass substrate. For example, the glass substrate may have a thickness of 0.4 mm to 0.6 mm but the present invention is not limited thereto. Alternatively, the support substrate 141 may be formed of any of various other materials capable of supporting the flexible substrate 111 and that are resistant to process stresses (e.g., transparent plastic or metal).

Although not shown in FIG. 9, a separation layer may be additionally formed between the support substrate 141 and the flexible substrate 111. The separation layer may be formed of any of various materials, and may be formed of a material appropriate to separate the support substrate 141 and the flexible substrate 111.

Figure 10:
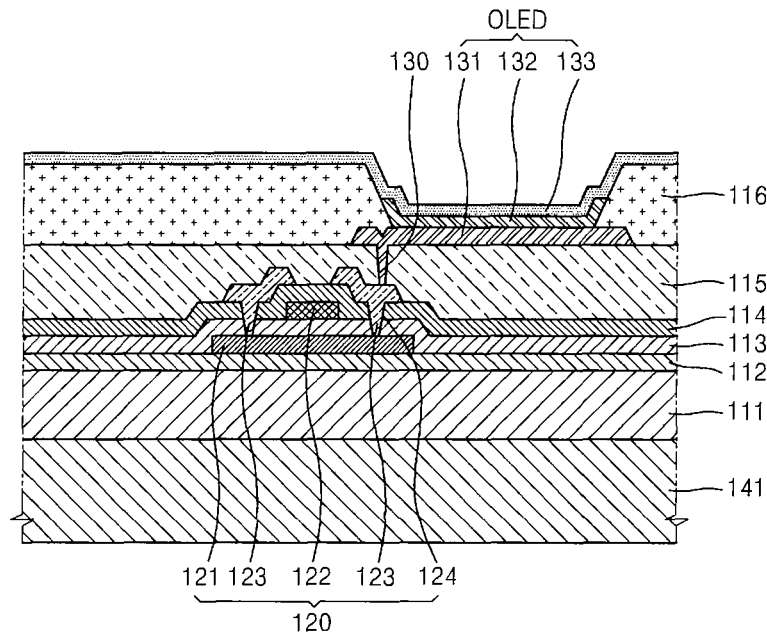

Then, referring to FIG. 10, an intermediate layer 132 including an emissive layer (EML) is formed on the exposed portion of the first electrode 131, and a second electrode 133 is formed on the intermediate layer 132 to face the first electrode 131 while the intermediate layer 132 is located between the first and second electrodes 131 and 133, thereby manufacturing the OLED. The intermediate layer 132 includes at least the emissive layer (EML), and may further include at least one of a hole injection layer ((HIL), a hole transport layer ((HTL), an electron transport layer (ETL), or an electron injection layer (EIL).

For convenience of explanation, FIG. 6 shows one subpixel, and, according to another embodiment, the intermediate layer 132 may also be formed integrally with the intermediate layer 132 of an adjacent sub-pixel. The intermediate layer 132 may be modified in various forms. For example, the intermediate layer 132 may include a plurality of layers, wherein one layer thereof may be formed to correspond to each sub-pixel and the other layers may be formed integrally with the intermediate layer 132 of an adjacent sub-pixel.

If the OLED is a full-color OLED, the emissive layer (EML) may be patterned to include red emissive layers, green emissive layers, and blue emissive layers according to red, green, and blue sub pixels. To emit white light, the emissive layer (EML) may have a multilayered structure in which red emissive layers, green emissive layers, and blue emissive layers are stacked, or may have a single layered structure including a red light emitting material, a green light emitting material, and a blue light emitting material.

The second electrode 133 may function as a cathode or an anode according to a function of the first electrode 131. Similar to the first electrode 131, the second electrode 133 may be formed as a transparent electrode or a reflective electrode. When the second electrode 133 is a transparent electrode, the second electrode 133 may include a layer formed of at least one material selected from the group consisting of Li, Ca, LiF/Ca, LiF/Al, Al, and Mg, and an auxiliary bus or a bus electrode line located on this layer and formed of a material for forming a transparent electrode, e.g., ITO, IZO, ZnO, or $In_2O_3$. When the second electrode 133 is a reflective electrode, the second electrode 133 is formed by depositing at least one material selected from Li, Ca, LiF/Ca, LiF/Al, Al, and Mg.

Figure 11:
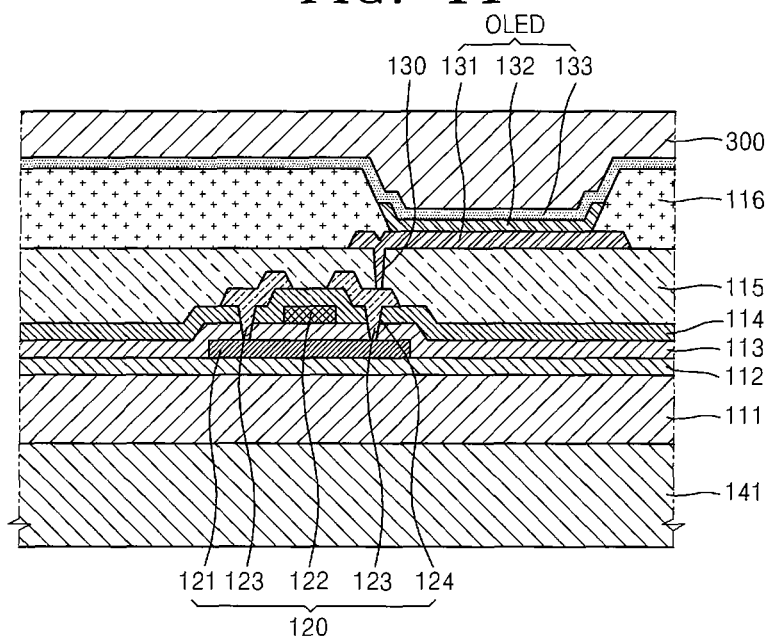

Referring to FIG. 11, an encapsulating layer 300 is formed on the second electrode 133 to encapsulate the OLED. The encapsulating layer 300 may be a barrier layer formed of an inorganic material, an organic material, or a combination thereof.

If the encapsulating layer 300 is an encapsulating thin film having a multilayer thin film structure obtained by sequentially depositing an inorganic material and an organic material, the inorganic material may protect the OLED against moisture, external substances or contaminants and the organic material may help perform planarizing and defect filling.

The organic material may be an organic insulating film including general polymer (PMMA, PS), a polymeric derivative of a phenol group, acryl-based polymer, imide-based polymer, arylether-based polymer, amide-based polymer, fluorine-based polymer, p-xylene-based polymer, vinyl alcohol-based polymer, or a combination thereof.

The inorganic material may be an inorganic insulating film including $SiO_2$, SiNx, SiON, $Al_2O_3$, $TiO_2$, $Ta_2O_5$, $HfO_2$, $ZrO_2$, BST, or PZT. An order in which the inorganic material and the organic material are depositing is variable. Alternatively, the encapsulating layer 300 may have a multilayered structure including at least one inorganic layer and at least one organic layer.

Figure 12:
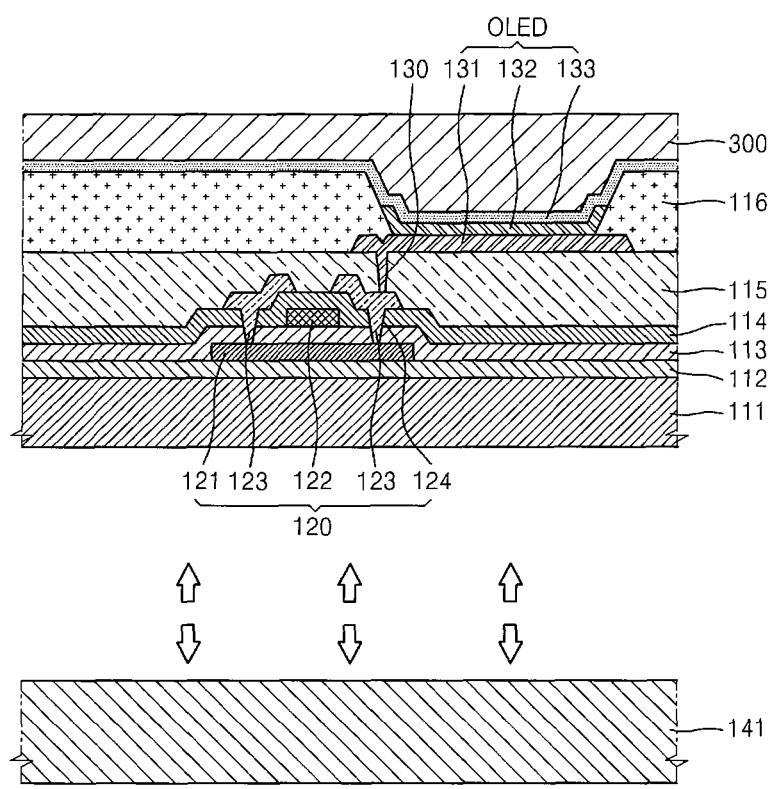

Then, referring to FIG. 12, an interlayer delamination process is performed to separate the flexible substrate 111 and the support substrate 141 from each other. This process may be performed using a physical mechanism or a user's hands.

Then, a cutting process is performed in units of panels.

Figure 13:
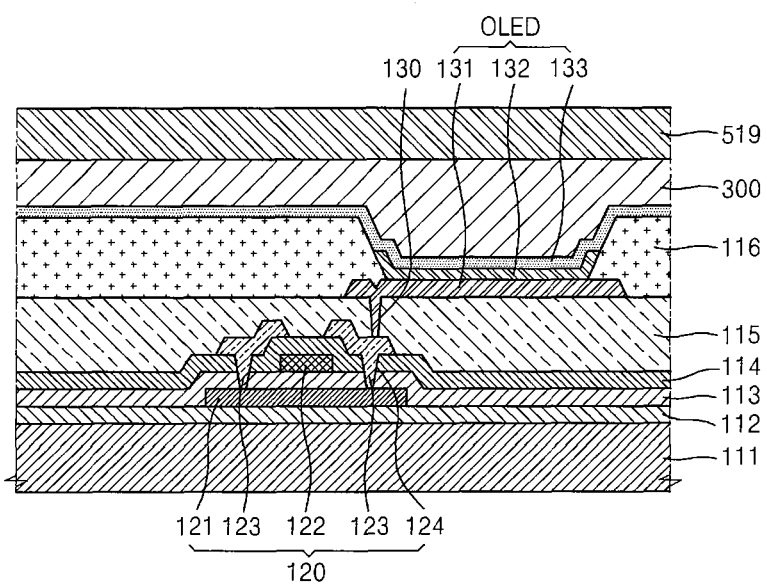

Then, referring to FIG. 13, a polarizing plate 519 is attached to the encapsulating layer 300. The polarizing plate 519 may be a linear polarizing plate or a linear polarizing film, and may have a single or multiple layer form.

A method of manufacturing a flexible display apparatus according to an embodiment of the present invention is designed to solve problems occurring when a high-temperature process is performed in a state in which the flexible substrate and the support substrate are combined with each other and the combined flexible substrate and support substrate are thus difficult from being easily separated from each other.

To prevent or reduce the occurrence of this problem, in the method of manufacturing a flexible display apparatus described above with reference to FIGS. 3 to 12, the first electrode 131 and the pixel defining film 116 are formed on the flexible substrate 111 according to the roll-to-roll method, and subsequent processes are performed after the flexible substrate 111 and the support substrate 141 are combined with each other. However, the present invention is not limited thereto, and the combining of the flexible substrate 111 and the support substrate 141 may be performed at a different time when process temperature is different from that described above with reference to FIGS. 3 to 12.

For example, after the pixel defining film 116 is formed, process conditions are modified such that a curing process performed at 230 to 250° C. is performed at a lower temperature, the flexible substrate 111 separated from the roll-to-roll device 1 may be combined with the support substrate 141 and a sequent process of forming the pixel defining film 161 may be performed.

When the OLED is formed on the first electrode 131 at a high temperature of 200° C. or more, the OLED may be formed on the flexible substrate 111 by using the roll-to-roll device 1, the flexible substrate 111 may be separated from the roll-to-roll device 1 and then be combined with the support substrate 141, and the subsequent processes may then be performed.

As described above, in a method of manufacturing a flexible display apparatus according to the above embodiments, high-temperature processes are performed on a flexible substrate by using a roll-to-roll device, and subsequent processes that are not required to be performed at a high temperature are performed in a state in which the flexible substrate is combined with a support substrate. Thus, because the subsequent processes are not performed on the combined flexible substrate and support substrate at a high temperature, the flexible substrate and the support substrate may be relatively easier to separate from each other, thereby preventing or substantially preventing the flexible substrate from being damaged, and increasing process reliability.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A method of manufacturing a flexible display apparatus, the method comprising:
    forming a thin film transistor (TFT), a first electrode, and a pixel defining film on a flexible substrate by using a roll-to-roll device;

separating the flexible substrate from the roll-to-roll device;
attaching the flexible substrate to a support substrate;
forming an organic light-emitting diode (OLED) and an encapsulating layer at the first electrode; and
separating the flexible substrate from the support substrate.

2. The method of claim 1, wherein the flexible substrate is a glass substrate.

3. The method of claim 2, wherein the glass substrate has a thickness in a range of 0.05 mm to 0.1 mm.

4. The method of claim 1, further comprising cleansing the flexible substrate after forming the TFT, the first electrode, and the pixel defining film, and before separating of the flexible substrate from the roll-to-roll device.

5. The method of claim 1, wherein the forming of the encapsulating layer comprises forming a multilayer comprising an organic layer and an inorganic layer on the OLED.

6. The method of claim 1, wherein the TFT, the first electrode, and the pixel defining film are formed at a temperature higher than a temperature at which the OLED and the encapsulating layer are formed on the first electrode.

7. A method of manufacturing a flexible display apparatus, the method comprising:
forming a thin film transistor (TFT), a first electrode, and a pixel defining film on a flexible substrate using a roll-to-roll device;
separating the flexible substrate from the roll-to-roll device and attaching the flexible substrate to a support substrate;
forming an intermediate layer comprising an emissive layer, and a second electrode on the first electrode; and
separating the flexible substrate from the support substrate.

8. The method of claim 7, wherein the flexible substrate is a glass substrate and has a thickness in a range of 0.05 mm to 0.1 mm.

9. The method of claim 7, wherein the support substrate is a glass substrate and has a thickness in a range of 0.4 mm to 0.6 mm.

10. The method of claim 7, further comprising, after forming the pixel defining film and before positioning the flexible substrate at the support substrate:
cleansing the flexible substrate; and
cutting the flexible substrate.

11. The method of claim 7, wherein the first electrode is an anode, and the second electrode is a cathode.

12. The method of claim 7, further comprising, after forming the second electrode and before separating the flexible substrate from the support substrate:
forming an encapsulating layer; and
forming a polarizing plate on the encapsulating layer.

13. The method of claim 7, wherein the TFT, the first electrode, and the pixel defining film are formed at a temperature higher than a temperature at which the intermediate layer comprising the emissive layer and the second electrode are formed on the first electrode.

14. A method of manufacturing a flexible display apparatus, the method comprising:
forming a thin film transistor (TFT), a first electrode, and a pixel defining film on a flexible substrate using a roll-to-roll device;
performing a cleansing process on the flexible substrate and attaching the flexible substrate to a support substrate;
forming an organic light emitting diode (OLED) on the flexible substrate and forming an encapsulating layer on the OLED; and
separating the flexible substrate from the support substrate.

15. The method of claim 14, wherein the flexible substrate and the support substrate are glass substrates, and
the flexible substrate is thinner than the support substrate.

16. The method of claim 14, wherein the flexible substrate has a thickness in a range of 0.05 mm to 0.1 mm, and
the support substrate has a thickness in a range of 0.4 mm to 0.6 mm.

* * * * *